United States Patent
Abutaleb et al.

(10) Patent No.: US 9,647,662 B1
(45) Date of Patent: May 9, 2017

(54) SUPERCONDUCTING TUNABLE COUPLER

(71) Applicants: Mohamed O. Abutaleb, Laurel, MD (US); Anthony Joseph Przybysz, Highland, MD (US); Joel D. Strand, Ellicott City, MD (US); Ofer Naaman, Ellicott City, MD (US)

(72) Inventors: Mohamed O. Abutaleb, Laurel, MD (US); Anthony Joseph Przybysz, Highland, MD (US); Joel D. Strand, Ellicott City, MD (US); Ofer Naaman, Ellicott City, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 15/192,756

(22) Filed: Jun. 24, 2016

(51) Int. Cl.
| | |
|---|---|
| *H03K 19/195* | (2006.01) |
| *H03K 19/0175* | (2006.01) |
| *H03K 19/00* | (2006.01) |
| *G06N 99/00* | (2010.01) |

(52) U.S. Cl.
CPC ... *H03K 19/017545* (2013.01); *G06N 99/002* (2013.01); *H03K 19/0005* (2013.01)

(58) Field of Classification Search
CPC .................. H03K 19/195; H03K 19/1952
USPC .......................................... 326/1–5
See application file for complete search history.

(56) References Cited

U.S. PATENT DOCUMENTS

| | | | |
|---|---|---|---|
| 7,498,832 B2 | 3/2009 | Baumgardner et al. | |
| 7,714,605 B2 | 5/2010 | Baumgardner et al. | |
| 8,242,799 B2 | 8/2012 | Pesetski et al. | |
| 8,654,578 B2 | 2/2014 | Lewis et al. | |
| 2002/0190381 A1* | 12/2002 | Herr ........................ | H01L 27/18 257/758 |
| 2003/0016069 A1* | 1/2003 | Furuta .................... | B82Y 10/00 327/367 |
| 2004/0201400 A1* | 10/2004 | Herr ........................ | G11C 11/44 326/3 |
| 2009/0322374 A1 | 12/2009 | Przybysz et al. | |

(Continued)

OTHER PUBLICATIONS

Chen, Yu, et al. "Qubit architecture with high coherence and fast tunable coupling." *Physical review letters* 113.22 (2014): 220502.
(Continued)

*Primary Examiner* — Jason M Crawford
(74) *Attorney, Agent, or Firm* — Tarolli, Sundheim, Covell & Tummino LLP (57) ABSTRACT

A superconducting system is provided that includes a coplanar superconducting circuit. The coplanar superconducting circuit includes a first ground plane region, a second ground plane region electrically isolated from the first ground plane region by portions of the coplanar superconducting circuit, and a tunable coupler having a first port and a second port. The tunable coupler comprises a variable inductance coupling element coupled between the first port and the second port, a first termination inductor having a first end coupled between a first end of the variable inductance element and a second end coupled to the first ground plane region, and a second termination inductor having a first end coupled between a second end of the variable inductance element and a second end coupled to the second ground plane region.

20 Claims, 8 Drawing Sheets

(56) References Cited

U.S. PATENT DOCUMENTS

2011/0018612 A1* 1/2011 Harris .................... B82Y 10/00
327/528
2011/0133770 A1* 6/2011 Przybysz ............... B82Y 10/00
326/5

OTHER PUBLICATIONS

Geller, Michael R., et al. "Tunable coupler for superconducting Xmon qubits: Perturbative nonlinear model." *Physical Review A* 92.1 (2015): 012320.
Harris, R., et al. "Compound Josephson-junction coupler for flux qubits with minimal crosstalk." *Physical Review B* 80.5 (2009): 052506.
Bialczak, R. C., et al. "Fast tunable coupler for superconducting qubits." *Physical review letters* 106.6 (2011): 060501.
Pinto, Ricardo A., et al. "Analysis of a tunable coupler for superconducting phase qubits." *Physical Review B* 82.10 (2010): 104522.
Harris, R., et al. "Sign-and magnitude-tunable coupler for superconducting flux qubits." *Physical review letters* 98.17 (2007): 177001.
Srinivasan, S. J., et al. "Tunable coupling in circuit quantum electrodynamics using a superconducting charge qubit with a V-shaped energy level diagram." *Physical review letters* 106.8 (2011): 083601.

* cited by examiner

SUPERCONDUCTING TUNABLE COUPLER

This invention was made with Government support under Contract No. 30059298. The Government has certain rights in this invention.

TECHNICAL FIELD

The present invention relates generally to superconducting circuits, and more particularly to a superconducting tunable coupler.

BACKGROUND

Quantum information processing implementations using superconducting qubits have made significant progress towards systems of useful integration complexity in recent years. In the standard conception of gate-based quantum computation, it is important that the qubits are decoupled from one another most of the time, and are selectively coupled during gate operations in a controllable manner. Tunable couplers are a common method of achieving this, and have been demonstrated using superconducting qubits in a number of different implementations. The vast majority of coupler devices and qubit circuitry reported in the literature, and those with the longest-lived qubit coherence times, are designed in coplanar two-dimensional geometries.

In coplanar microwave integrated circuit design, the routing of signal traces and microwave components necessitates a severance of the ground planes due to the two-dimensional constraint of the geometry. The severance of the ground planes allows them to maintain different electrical potentials, and undesired parasitic modes can propagate along the RF signal paths when the ground potentials are unequal. Conventional tunable couplers have used air bridges or wire bonds to suppress the propagation of undesired modes across the coupler. Air bridges are important components used mainly to suppress such undesired modes, but are not available in all 2D circuit fabrication processes. Wire bonds employed as jumpers between ground sections can also be used to suppress such modes, but their effectiveness is limited by their much higher inductance than a continuous ground plane metal interconnect. Different signal propagation times arise at discontinuities such as air bridges and wire bonds, and undesired modes can propagate if the structure is not placed symmetrically inside a circuit layout.

SUMMARY

In one example, a superconducting system is provided that comprises a coplanar superconducting circuit. The coplanar superconducting circuit comprises a first ground plane region, a second ground plane region electrically isolated from the first ground plane region by portions of the coplanar superconducting circuit, and a tunable coupler having a first port and a second port. The tunable coupler comprises a variable inductance coupling element coupled between the first port and the second port, a first termination inductor having a first end coupled between a first end of the variable inductance element and a second end coupled to the first ground plane region, and a second termination inductor having a first end coupled between a second end of the variable inductance element and a second end coupled to the second ground plane region.

In another example, a superconducting system is provided that comprises a coplanar circuit and a controller. The coplanar circuit comprises a first ground plane region, a second ground plane region electrically isolated from the first ground plane region by portions of the superconducting circuit, and a tunable coupler with a first port and a second port. The tunable coupler further comprises a Josephson junction, a first termination inductor having a first end coupled between a first end of the Josephson junction and the first port and a second end coupled to the first ground plane region, and a second termination inductor having a first end coupled between a second end of the Josephson junction and the second port and a second end coupled to the second ground plane region.

The tunable coupler also includes a third termination inductor having a first end coupled between the first end of the Josephson junction and the first port and a second end coupled to the second ground plane region, and a fourth termination inductor having a first end coupled between the second end of the Josephson junction and the second port and a second end coupled to the first ground plane region, wherein the equivalent inductance of the first and third termination inductors, the Josephson junction and the equivalent inductance of the second and fourth termination inductors combine to form an RF SQUID. The controller is configured to control the inductance of the Josephson junction between a low inductance state to provide strong coupling between a first device coupled to the first port and a second device coupled to the second port, and a high inductance state to provide isolation between the first device and the second device.

In yet a further example, a superconducting coplanar circuit is provided that comprises a first ground plane region, a second ground plane region electrically isolated from the first ground plane region by portions of the superconducting coplanar circuit, and a tunable coupler having a first port and a second port. The tunable coupler comprises a variable inductance coupling element, a first termination inductor having a first end coupled between a first end of the variable inductance element and the first port and a second end coupled to the first ground plane region, a second termination inductor having a first end coupled between a second end of the variable inductance element and the second port and a second end coupled to the second ground plane region, a third termination inductor having a first end coupled between the first end of the Josephson junction and the first port and a second end coupled to the second ground plane region, a fourth termination inductor having a first end coupled between the second end of the Josephson junction and the second port and a second end coupled to the first ground plane region, and a fifth inductor having a first end coupled to the Josephson junction, and a second end coupled between the first and third termination inductors, wherein the equivalent inductance of the first and third termination inductors, the Josephson junction and the equivalent inductance of the second and fourth termination inductors and fifth inductor combine to form an RF SQUID. The superconducting circuit further comprises a qubit coupled to the first port, and a bias inductor inductively coupled to the RF SQUID, wherein an amount of current through the bias inductor controls the coupling strength between the qubit and a second device coupled to the second port.

BRIEF DESCRIPTION OF THE DRAWINGS

FIG. 8 (a) illustrates a schematic of the experimental circuit under test.

FIG. 8 (b) illustrates a modeled coupler effective inductance $L_{eff}$, resonator frequency $\omega_{res}/2\pi$, and magnitude of effective mutual inductance $|M|$.

FIG. 8 (c) illustrates modulation of resonator frequency with applied flux, showing measured data and model fit.

FIG. 8 (d) illustrates modulation of $Q_i$ with applied flux, showing measured data and model fit.

DETAILED DESCRIPTION

The present disclosure relates generally to superconducting circuits, and more particularly to a superconducting tunable coupler with component ground plane contacts that facilitate an equipotential between ground plane regions in a coplanar layer. In one example, a direct connection is provided between ground plane regions to either side of the tunable coupler using separate lumped-element inductances that form part of the coupler device. The coupler can be tunable by employing one or more variable inductance coupling elements between the lumped-element inductances that form part of the coupler device.

The variable inductance coupling element can be adjusted between a strongly coupled state and a decoupled (or isolated) state between a qubit and one or more other superconducting devices in addition to various other states of intermediate coupling strengths in between. In this manner, manipulation can be performed on state information of an isolated qubit in a decoupled state, or this state information can be exchanged during a strongly coupled state. Furthermore, state information can be manipulated and passed without destroying the state information of the originating device in an intermediate coupling strength state. In one example, the variable inductance coupling element can be a Josephson junction. A variable inductance coupling element can be arranged as a single Josephson junction or series array of N Josephson junctions, each having a critical current N times larger than the original Josephson junction.

In another example, an RF-SQUID tunable coupler includes a Josephson junction embedded in the middle of lumped inductance elements. The Josephson junction can have a first inductance when no current is induced in the SQUID, and a second inductance when a current is induced in its respective SQUID that generates or induces a flux of about 0.4 $\Phi_0$, where $\Phi_0$ is equal to a flux quantum. The first inductance (e.g., $\hbar/2e*1/I_c$, where $\hbar$ is Planck's constant divided by $2\pi$, e is electron charge and $I_c$ is the critical current of the Josephson junction) can provide coupling between the first and second qubits. The second inductance (e.g., large inductance value) can provide decoupling between the first and second qubits.

Figure 1:
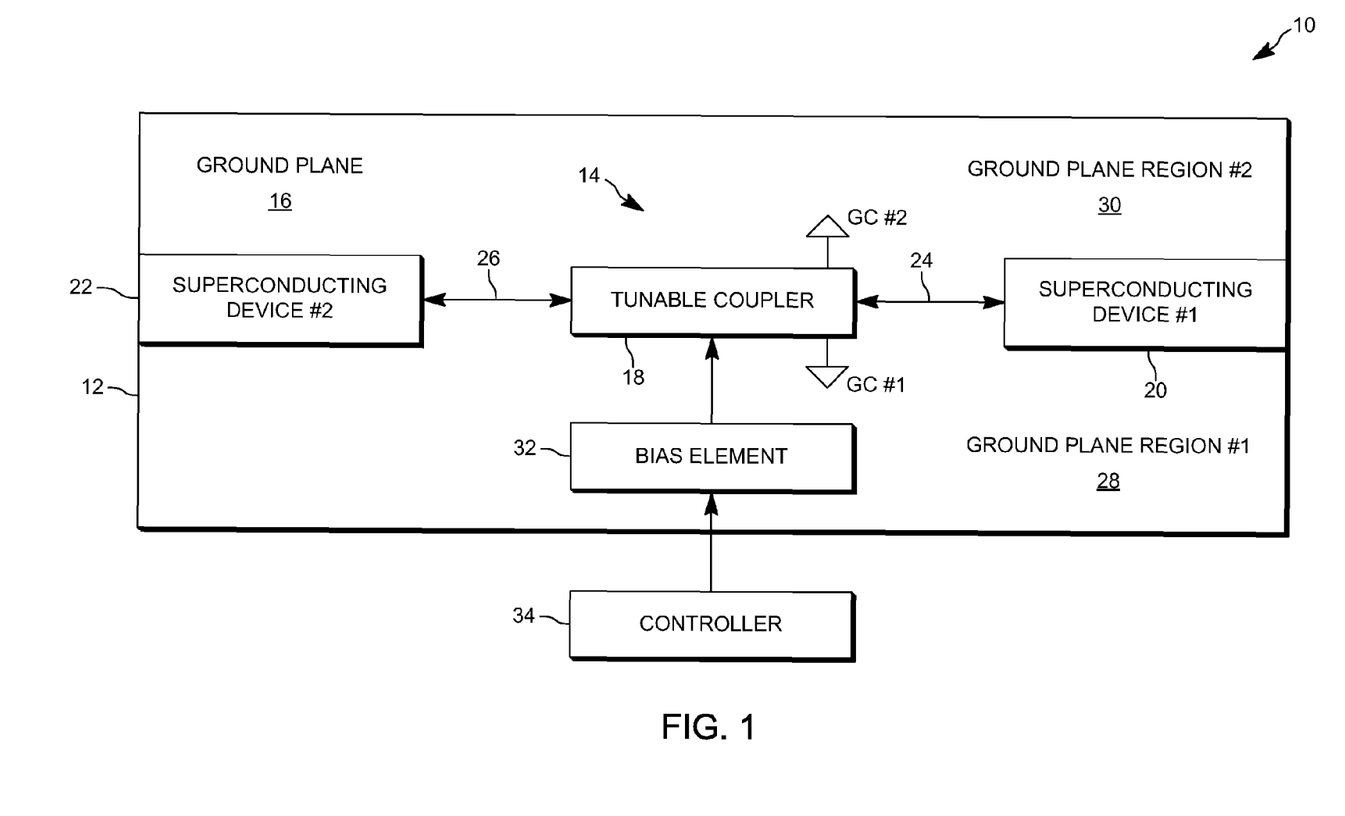
FIG. 1 illustrates a block diagram of an example of a superconducting system that includes a coplanar superconducting circuit residing in a coplanar layer.

FIG. 1 illustrates a block diagram of an example of a superconducting system 10 that includes a coplanar superconducting circuit 14 residing in a coplanar layer 12. The coplanar superconducting circuit 14 can be formed of a metal layer overlying a dielectric layer with portions of the metal layer etched away or removed to form the coplanar superconducting circuit 14 residing within a ground plane 16 separated from one another by the etched away portions of the metal layer. The coplanar superconducting circuit 14 includes a tunable coupler 18 that is configured to couple and decouple a first superconducting device 20, labeled superconducting device #1 and a second superconducting device 22, labeled superconducting device #2. The tunable coupler 18 includes a variable inductance coupling element that can be controlled to control the strength of the coupling between opposing ends of the tunable coupler 18. The first superconducting device 20 is connected to the tunable coupler 18 by a first conductive line 24 and the second superconducting device 22 is coupled to the tunable coupler by a second conductive line 26. The first and second superconducting devices 20 and 22 can be any of qubits, resonators, superconducting gates or conventional gates, or other coupleable devices or combinations of these devices.

The layout of the tunable coupler 18, the first and second superconductive devices 20 and 22 and first and second superconducting lines 24 and 26 cause the separation of the ground plane 16 into a first ground plane region 28 and a second ground plane region 30. The separation in the ground plane 16 into separate ground plane regions 28 and 30 results in a non-equal potential and unequal impedance between the first and second ground plane regions 28 and 30 causing undesired parasitic modes. The tunable coupler 18 includes at least a first direct ground connection GC #1 to the first ground plane region 28 and a second direct ground connection GC #2 to the second ground plane region 30 to assure equipotentials between the first ground plane region 28 and the second ground plane region 30. In one example (FIG. 2), the tunable coupler includes a direct connection between ground plane regions to either side of the tunable coupler 18 using lumped-element inductances that form part of the coupler device. The tunable coupler utilizes a coupler architecture compatible with allowing the subcomponent inductances of the coupler to connect to ground plane regions, rather than structures external to the coupler (e.g., air bridges, wire bonds).

The superconducting circuit 14 also includes a bias element 32 that can be controlled by a controller 34 to control the flux induced in the tunable coupler 18. The amount of current through the bias element 32 can be controlled between two or more states to change the amount of flux induced in the tunable coupler 18 and thus the coupled state of the tunable coupler 18 between a coupled state and an isolated state. The controller 34 can reside in a separate region of the same layer that the coplanar circuit resides or the controller 34 can reside in a separate layer or device from the layer where the coplanar circuit resides. Similarly, the second superconducting device 22 can reside in a separate region of the same layer that the coplanar circuit resides or the second superconducting device 22 can reside in a separate layer from the layer where the coplanar circuit resides.

Figure 2:
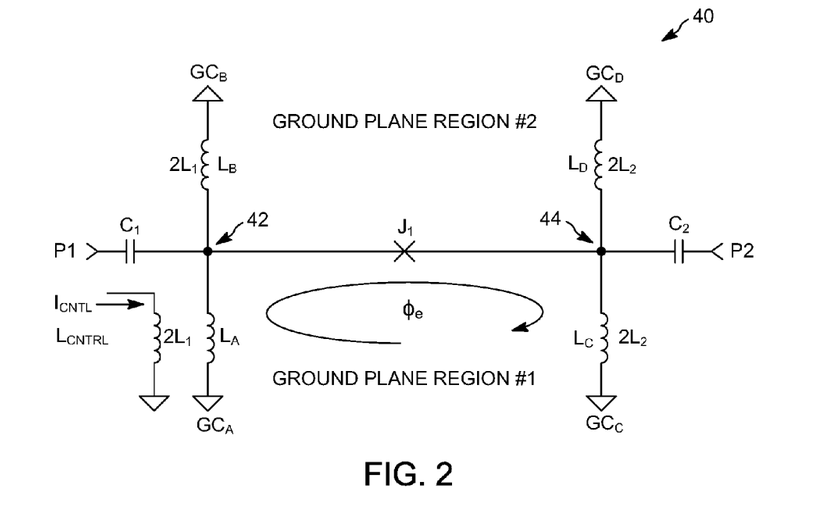
FIG. 2 illustrates a schematic diagram of one example of a coplanar tunable coupler circuit.

In one particular example, the tunable coupler 18 is formed using a flux-tunable inductance comprised of one or more Josephson junctions and lumped element inductances. FIG. 2 illustrates a schematic diagram of one example of a coplanar tunable coupler circuit 40. In the schematic of FIG. 2, a network of metal interconnects are modeled as lumped element inductances, acting both as components of the tunable coupler 40 and the connection points between a first ground plane region (GROUND PLANE REGION #1) and a second ground plane region (GROUND PLANE REGION #2). One or more coupled devices can be connected at a first pin or port $P_1$ and one or more other coupled devices can be connected at a second pin or port $P_2$. The first port $P_1$ is coupled to a first node 42 through a first coupling capacitance $C_1$, and a second port $P_2$ is coupled to a second node 44 through a second coupling capacitance $C_2$. Coupling inductances between the coupled devices formed by conductive lines of the tunable coupler 40 to the coupled devices have been omitted from the schematic of FIG. 2 for simplicity sake.

The coplanar tunable coupler circuit 40 also includes a first inductor $L_A$ having inductance $2L_1$ coupled between the first node 42 and a first ground connector $GC_A$ that is coupled to the first ground plane region #1, and a second inductor $L_B$ having inductance $2L_1$ coupled between the first node 42 and a second ground connector $GC_B$ that is coupled to the second ground plane region #2. Coupling the first and second inductors to opposing ground plane regions provides a DC ground to the first node 42 and thus mitigates distortion of signals passing through the first port $P_1$ of the tunable coupler 40. Furthermore, coupling the first and second inductors $L_A$ and $L_B$ to opposing ground plane regions provides for a stable DC ground to the devices coupled to the first port $P_1$ and facilitates a equipotential between the first and second ground plane regions through the tunable coupler 40.

The coplanar tunable coupler circuit 40 also includes a third inductor $L_C$ having inductance $2L_2$ coupled between the second node 44 and a third ground connector $GC_C$ that is coupled to the first ground plane region #1, and a fourth inductor $L_C$ having inductance $2L_2$ coupled between the second node 44 and a fourth ground connector $GC_D$ that is coupled to the second ground plane region #2. Coupling the third and fourth inductors to opposing ground plane regions provides a DC ground to the second node 44 and thus mitigates distortion of signals passing through the second port $P_2$ of the tunable coupler 40. Furthermore, coupling the third and fourth inductors $L_C$ and $L_D$ to opposing ground plane regions provides for a stable DC ground to the devices coupled to the first port $P_2$ and facilitates a equipotential between the first and second ground plane regions through the tunable coupler 40.

The coupler 40 is compatible with single flux quantum (SFQ) control or traditional microwave control of qubits. The enclosed flux value in FIG. 2, $\Phi_e$ is supplied by mutually coupled flux lines carrying current $I_e$. The current $I_e$ can be induced as a result of a control current $I_{CNTRL}$ flowing from an external current source or from an SFQ controller through a control inductor $L_{CNTRL}$ mutually coupled to the first inductor $L_A$ that induced flux $\Phi_e$ through a SQUID formed by parallel inductances of the first inductor $L_A$ and the second inductor $L_B$, a Josephson junction $J_1$ and parallel inductances of the third inductor $L_C$ and the fourth inductor $L_D$. The amount of flux through the SQUID controls the inductance of the Josephson junction $J_1$ and thus the coupling strength between devices connected to the port P1 and the devices connected to the port P2.

Figure 3:
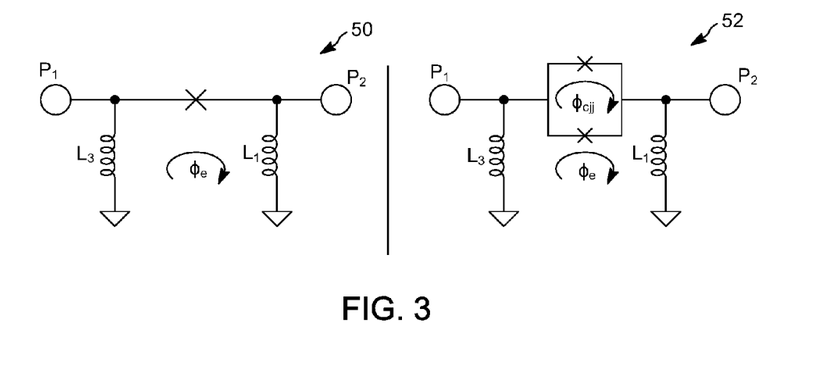
FIG. 3 illustrates a schematic diagram of a single Josephson junction (SJJ) coupler and a compound Josephson junction (CJJ) coupler.

This opposing ground plane region coupling technique can be employed for both a single Josephson junction (SJJ) coupler 50 and a compound Josephson junction (CJJ) coupler 52 both schematically illustrated in FIG. 3. For the SJJ coupler 50, the loop encloses a flux $\Phi_e$ supplied via a mutually coupled flux line carrying a current $I_e$. For the CJJ coupler 52, the loop contains two Josephson junctions in parallel, enclosed in a loop having a linear inductance smaller than the inductance of the junctions. The CJJ loop encloses a flux $\Phi_{cjj}$ and the coupler body loop encloses a flux $\Phi_e$, both supplied via mutually coupled flux lines carrying appropriate currents.

The enclosed flux values in the CJJ coupler 52 of FIG. 3, $\Phi_e$ and $\Phi_{cjj}$, are supplied by mutually coupled flux lines carrying currents $I_e$ and $I_{cjj}$, respectively. The currents can be supplied from an external current source or from an SFQ controller. For the SJJ coupler 50, the coupling coefficient between two objects denoted by a and 13 can be expressed with the expression given in Equation 1:

$$g = I_\alpha \frac{dI_\beta}{dI_\alpha} MI_\beta \qquad \text{Equation 1}$$

Figure 5:
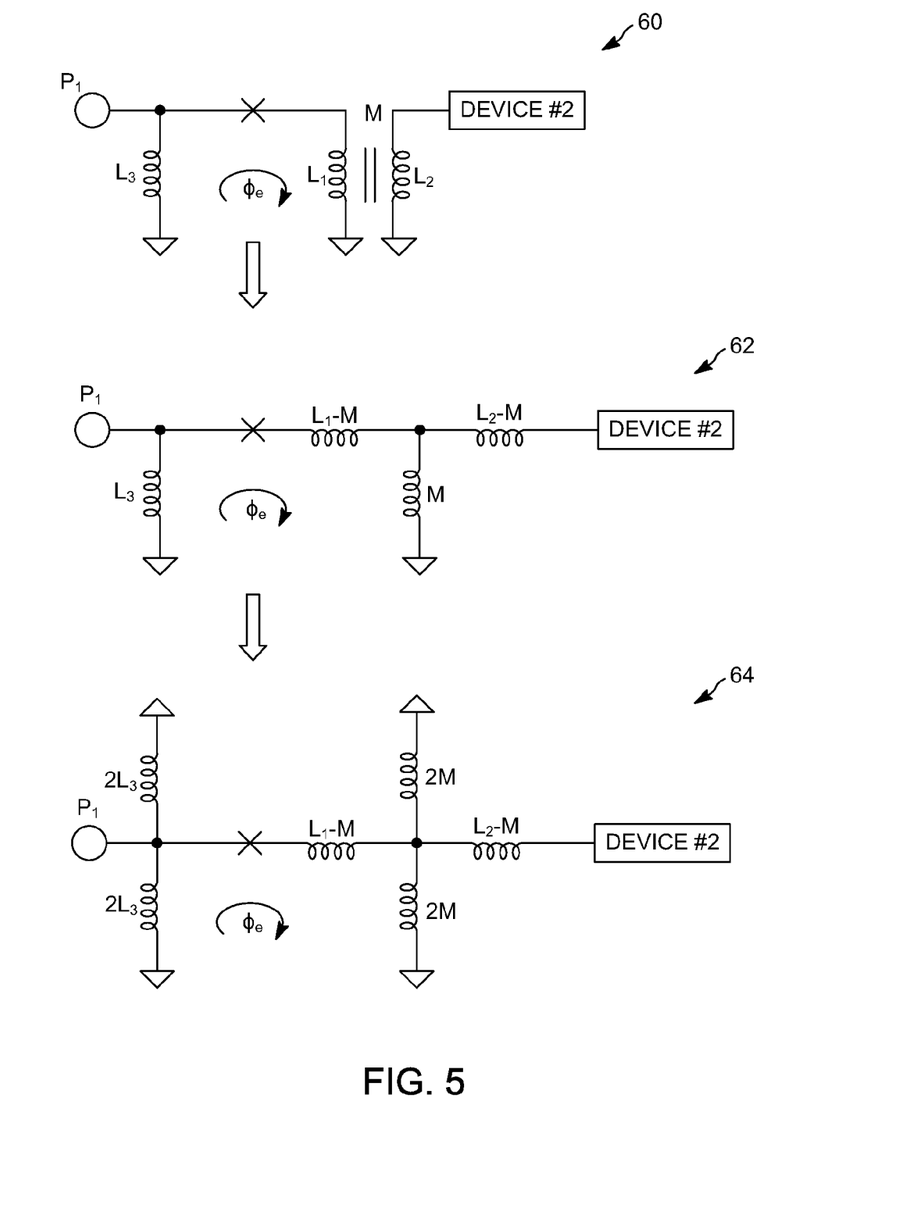
FIG. 5 illustrates schematics of a transformation of traditional coupler to a tunable coupler with interconnected ground plane regions.

The current $I_\alpha$ is supplied to the coupler via a galvanic connection and the RF SQUID couples via a transformer with mutual inductance M to $I_\beta$, as in the top schematic of FIG. 5. The coupling coefficient varies as the local slope of $I_\beta$ with increasing control current as the flux line tunes the coupler from a small positive coupling at zero flux, through zero coupling, to a maximal, negative coupling value at a half flux quantum, $\phi_0/2$. The coupling coefficient of the special case of two galvanically connected qubits is given in Equation 2. The CJJ coupler operates similarly, with the additional degree of freedom allowing tuning of the relative minimum and maximum coupling points with respect to $\phi_{cjj}$.

$$g = \frac{\omega_0}{2} \frac{L_3}{(L_J + L_1)} \frac{L_1}{(L_3 + L_1 + L_c(\Phi_e))} \qquad \text{Equation 2}$$

It is to be appreciated that the tunable coupler 40 of FIG. 2, and thus the corresponding SQUID has an equivalent circuit similar to the tunable coupler 50 of FIG. 3. In this manner, conventional SQUID circuit configurations that can be employed as tunable couplers as illustrated in FIG. 3 can be transformed into an equivalent SQUID circuit configuration with circuit elements that provide ground connections to opposing ground plane regions, as illustrated in the tunable coupler 40 of FIG. 2. This type of circuit transition will be discussed in FIGS. 4-7.

Figure 4:
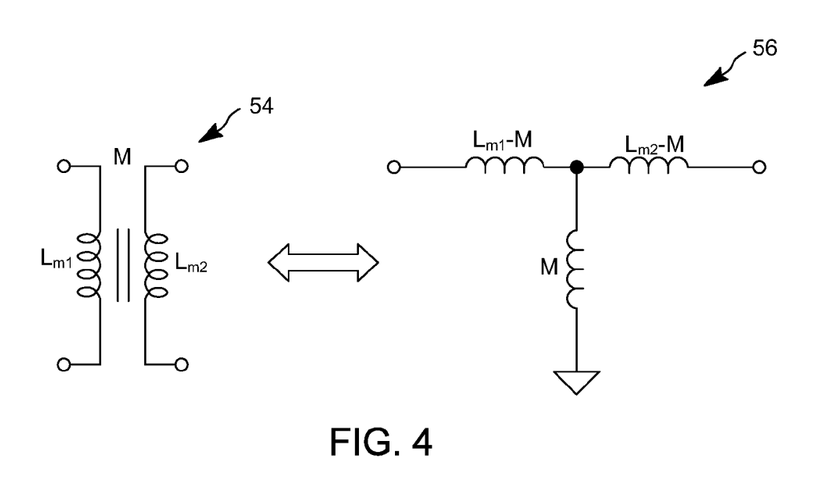
FIG. 4 illustrates schematics of a transformer to T-Network transformation.

It is to be appreciated that the equivalent inductance transformation of FIG. 4 can be employed to transform a traditional SJJ or CJJ coupler architecture to one compatible with interconnected ground planes isolated from one another on a coplanar layer. For example, consider the progression outlined in FIG. 5, with a device mutually coupled to the coupler on the right side as shown in top pane 60. Applying the transformation yields an equivalent coupler architecture with galvanic coupling to the device in the middle pane 62. Finally, transforming the ground shunt inductances to parallel equivalents yields galvanic interconnects between ground planes to either side of the coupler as shown in the bottom pane 64.

Another practical advantage of this architecture is that the coupling can be made larger, as the practical limitation on M is higher than in the original, mutual inductance design. Additional design flexibility is afforded in that part of the L1-M and L2-M can be absorbed into the junction and Device #2, respectively, to the extent that the inductances are well approximated as lumped elements. For an original coupler architecture galvanically coupled to Device #2, transforming the ground shunt inductances to parallel equivalents readily yields a coupler architecture with galvanically connected ground planes. Therefore, the present invention is compatible with both galvanically and mutually coupled devices to the coupler.

Figure 6:
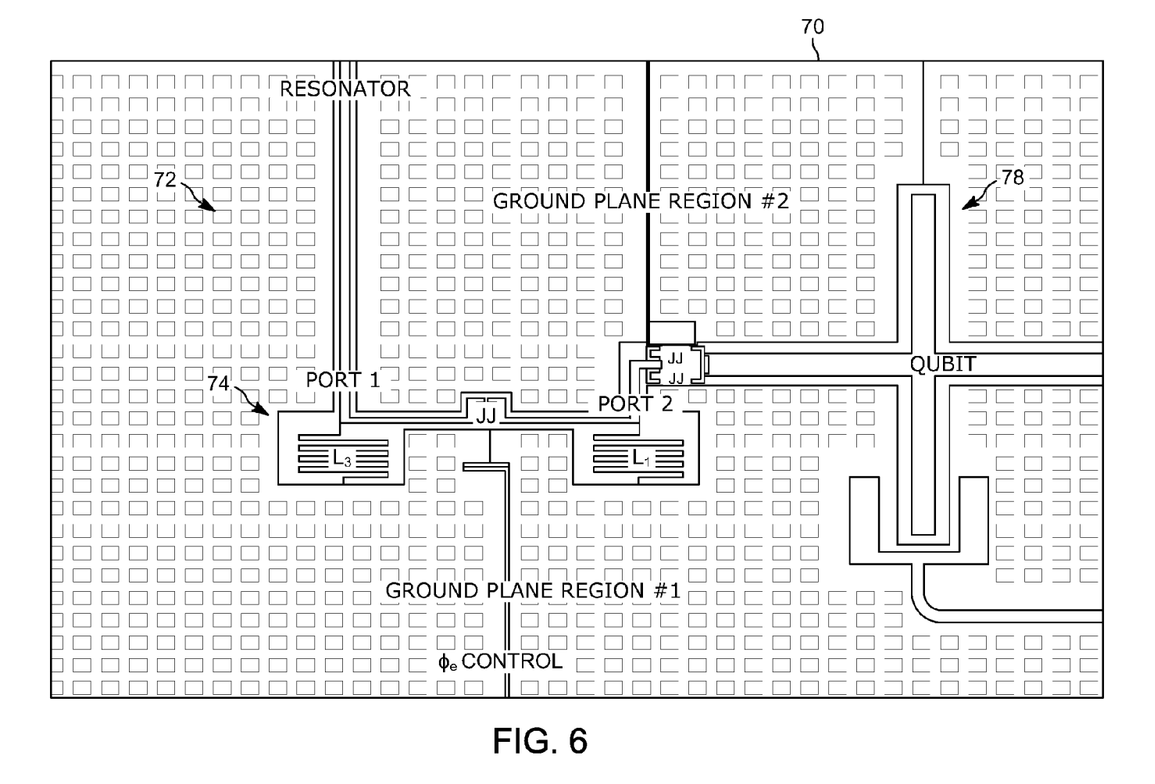
FIG. 6 illustrates a plan view of a portion of a coplanar layer having a coplanar superconducting circuit that includes a coplanar tunable coupler having a jumper device that couples opposing isolated ground plane regions of a ground plane

FIG. 6 illustrates a plan view of a portion of a coplanar layer 70 having a coplanar superconducting circuit 72 that includes a coplanar tunable coupler 74 having a jumper device 76 that couples opposing isolated ground plane regions to one another. The coplanar superconducting circuit 72 is formed, for example, by etching portions of a metal layer away that overlies a dielectric layer to form the coplanar superconducting circuit 72 surrounded by a ground plane. The coplanar superconducting circuit 72 separates the ground plane into a first ground plane region (Ground plane region #1) and a second ground plane region (Ground plane region #2) electrically isolated from one another. The separation and isolation of the ground plane regions can cause the ground plane regions to maintain different electrical potentials, and can result in undesired parasitic modes that can propagate along the RF signal paths when the ground potentials are unequal.

The coplanar tunable coupler 74 includes a first inductor L3 coupled at a first port (Port 1), and second inductor L1 coupled at a second port (Port 2), and a Josephson junction (JJ) 76 coupled between the first port and the second port. The first inductor, the second inductor and the JJ form an RF SQUID. Both the first inductor L3 and the second inductor L1 are grounded at the first ground plane region. The first port is coupled to a resonator (not shown) and the second port is coupled to a Qubit 78. A flux control line is coupled to the RF SQUID to induce flux into the RF SQUID and control the coupling strength of the tunable coupler between the resonator and the Qubit. In order to electrically connect ground plane region #1 with ground plane region #2, a wire bond jumper would have to be added. The effectiveness of a wire bond for creating an equipotential is limited by it much higher inductance compared with a continuous ground plane metal interconnect. Different signal propagation times can arise at the discontinuities of a jumper, and undesired modes can propagate if the jumper is not place symmetrically inside the circuit layout.

Figure 7:
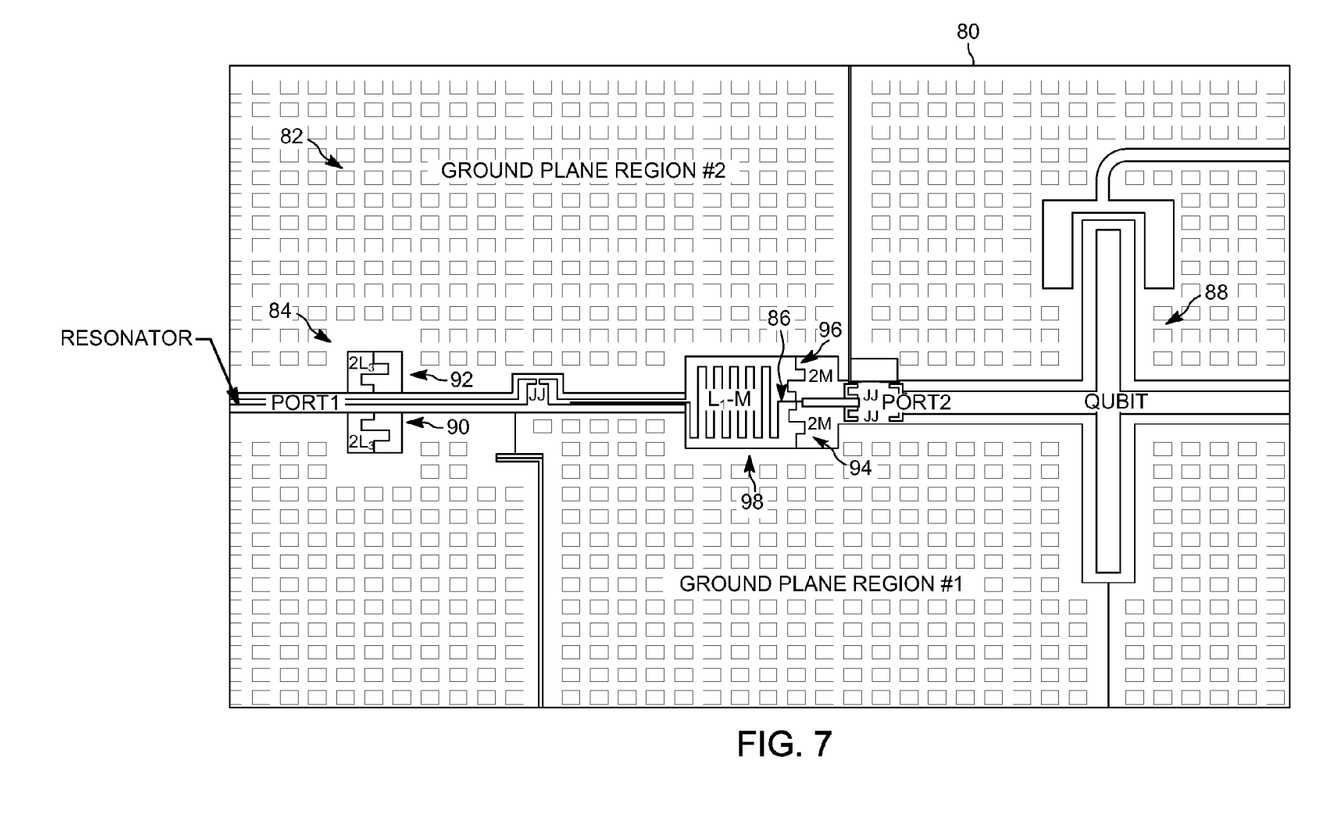
FIG. 7 illustrates a plan view of a portion of a coplanar layer with a coplanar superconducting circuit that includes a coplanar tunable coupler coupled to opposing isolated ground plane regions of a ground plane.
Figure 8A:
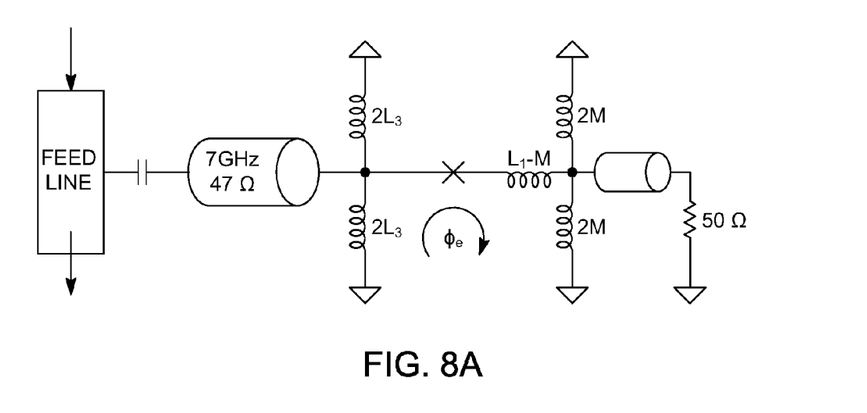
Figure 8B:
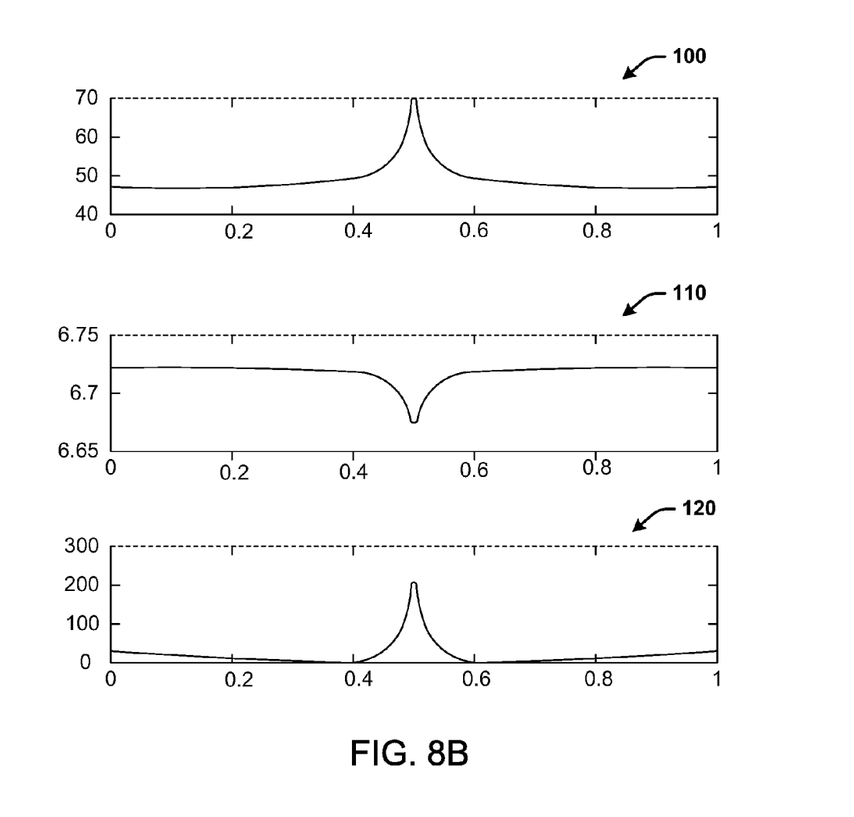
Figure 8C:
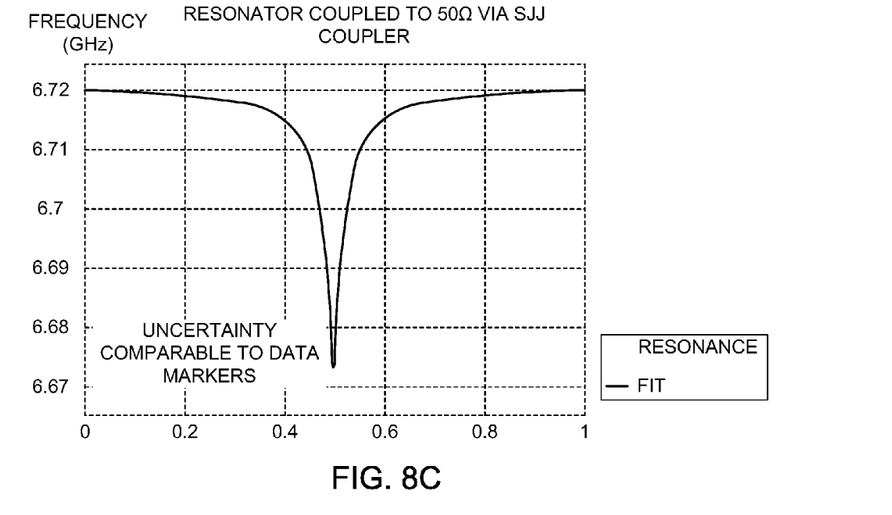
Figure 8D:
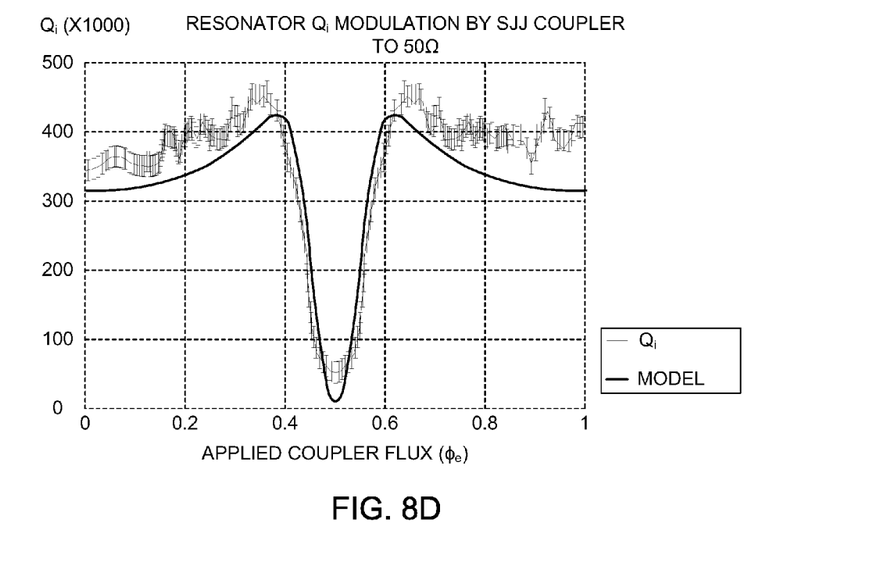

FIG. 7 illustrates a plan view of a portion of a coplanar layer 80 with a coplanar superconducting circuit 82 that includes a coplanar tunable coupler 84 having separate lumped elements to couple opposing isolated ground plane regions of a ground plane. The coplanar superconducting circuit 82 separates the ground plane into a first ground plane region (Ground plane region #1) and a second ground plane region (Ground plane region #2). The separation of the ground plane can cause the first and second ground plane regions to maintain different electrical potentials, and can result in undesired parasitic modes that can propagate along the RF signal paths when the ground potentials are unequal.

The coplanar tunable coupler 84 includes a first inductor 90 having inductance 2*L3 coupled between a first port (Port 1) and the first ground plane region, and a second inductor 92 having an inductance 2*L3 coupled between the first port and the second ground plane region. The parallel inductance of the first and second inductors 90 and 92 is equivalent to the inductance L3 of FIG. 5. The coplanar tunable coupler 84 also includes a third inductor 94 having an indutance 2*M coupled between the second port (Port 2) and the first ground plane region, and a fourth inductor 96 having an inductance 2*M coupled between the second port and the second ground plane region. A fifth inductor 98 has an inductance L1-M is coupled between the second port and a Josephson junction (JJ), which is also coupled to the first port, where M is the mutual inductance between L1 and L2, such that L2 is the inductance of a conductive line from a coupling node 86 between the third and fourth inductors 94 and 96 and a Qubit 88. The third inductor 94, the fourth inductor 96, and the fifth inductor 98, having an equivalent inductance of L1 of FIG. 5. Therefore, the first through fifth inductors and the JJ form an RF SQUID equivalent to the RF SQUID in FIG. 5. However, since the inductors of the tunable coupler 84 are DC coupled to the first and second opposing ground plane regions, the deleterious effects caused by the lack of equipotential between the ground plane regions and the problems associated with jumpers to the opposing ground plane regions are mitigated.

As an example, an SJJ coupler device was modeled, designed and fabricated. The coupler was connected to a quarter-wave resonator on one side and to a transmission line to a dissipative 50Ω environment on the other side. Applying a physical model to the device, data was obtained with model fit parameters β=L/Lj=0.83, L3=49 pH (design 50 pH), L1=534 pH (design 540 pH) yielding M=17 pH (design 20 pH), and Josephson junction critical current $I_c$=400 nA. The coupled resonator parameters are unloaded resonant frequency $f_{res}$=6.83 GHz and resonator impedance Zo=50Ω (design 47Ω).

The results of the experiment are illustrated in FIGS. 8 (a-d). FIG. 8(a) illustrates a schematic of the experimental circuit under test. FIG. 8(b) illustrates graph 100 of a modeled coupler effective inductance $L_{eff}$, a graph 110 of a resonator frequency $\omega_{res}/2\pi$, and a graph 120 of a magnitude of effective mutual inductance |M| all versus $\Phi_e/\Phi_0$ with model parameters given in the paragraph above. FIG. 8(c) illustrates modulation of resonator frequency with applied flux, showing measured data and model fit. FIG. 8(d) illustrates modulation of $Q_i$ with applied flux, showing measured data and model fit.

The tunable coupler inductively loads the shorted end of the quarter-wave resonator, resulting in a frequency modulation that is well described by Equation 3 (Frequency modulation of resonator loaded by SJJ coupler), where $L_{res}$ and $C_{res}$ are the resonator's effective total inductance and capacitance, respectively.

$$f = \frac{1}{2\pi\sqrt{C_{res}(L_{res} + L_{eff})}} \qquad \text{Equation 3}$$

The coupler's effective inductance $$L_{eff} = \left[\frac{1}{L_3} + \frac{1}{L_1 + L_J}\right]^{-1}$$

is tuned by applying an external flux to the coupler RF SQUID loop, modulating the junction's effective inductance LJ. The coupling is tuned to zero near $\Phi_e$=0.4 $\Phi_0$, from a small positive coupling at zero flux and a maximum, negative coupling at $\Phi_e$=0.5 $\Phi_0$. The fits of the model agree well with the data. The resonator Q is also modulated by the coupler, as an inductive coupling channel that is opened to a dissipative 50 Ohm environment. The model parameters determined from the frequency modulation fit are used here, as the parameters are better constrained by the simpler frequency modulation experiment than the Q data. Two degrees of freedom are used for the Q modulating fit: the coupling efficiency $k_{eff}$ and the internal damping ratio $v_{int}=1/Q_{int}$. The modulation of Q is given in Equation 4 (Modulation of Q with the tuning of the coupler), where the effective mutual inductance M=L1L3/(L1+L3+LJ).

$$Q_i = (v_{int} + v_{load})^{-1} = \left[ v_{int} + \left( \frac{2\pi f k_{eff} M}{Z_{res}} \right)^2 \right]^{-1} \quad \text{Equation 4}$$

In summary, the present invention is a coplanar tunable coupler achieving a direct connection between ground plane regions to either side of the tunable coupler using lumped element inductances that form part of the coupler device. The invention improves upon the art through a direct interconnect between ground planes without the use of discontinuities such as air-bridges or wirebonds.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A superconducting system comprising:
   a coplanar superconducting circuit comprising:
      a first ground plane region;
      a second ground plane region electrically isolated from the first ground plane region by portions of the coplanar superconducting circuit: and
      a tunable coupler having a first port and a second port, the tunable coupler comprising:
         a variable inductance coupling element coupled between the first port and the second port;
         a first termination inductor having a first end coupled between a first end of the variable inductance element and a second end coupled to the first ground plane region; and
         a second termination inductor having a first end coupled between a second end of the variable inductance element and a second end coupled to the second ground plane region.

2. The system of claim 1, wherein the variable inductance coupling element comprises one or more Josephson junctions.

3. The system of claim 1, wherein the first termination inductor is coupled to a first port of the tunable coupler and the second termination inductor is coupled to the second port of the tunable coupler.

4. The system of claim 3, wherein the variable inductance coupling element is a Josephson junction, and further comprising a third termination inductor having a first end coupled between the first end of the Josephson junction and the first port and a second end coupled to the second ground plane region, and a fourth termination inductor having a first end coupled between the second end of the Josephson junction and the second port and a second end coupled to the first ground plane region, wherein the equivalent inductance of the first and third termination inductors, the Josephson junction and the equivalent inductance of the second and fourth termination inductors combine to form an RF SQUID.

5. The system of claim 4, further comprising a fifth inductor having a first end coupled between the Josephson junction a second end coupled between the second termination inductor and the fourth termination inductor and the second port, wherein the equivalent inductance of the first and third termination inductors, the Josephson junction and the equivalent inductance of the second and fourth termination inductors and fifth inductor combine to form an RF SQUID.

6. The system of claim 5, further comprising a bias inductor inductively coupled to the RF SQUID, wherein an amount of current through the bias inductor controls the coupling strength between the first and the second devices.

7. The system of claim 6, wherein one of a zero current through the bias inductor induces no net flux in the RF SQUID allowing for coupling between a first device coupled to the first port and a second devices coupled to the second port, a first current through the bias inductor induces a net flux in the RF SQUID of about 0.4 $\Phi_0$, where $\Phi_0$ is equal to a flux quantum allowing maximum isolation between the first device and the second device, and a second current through the bias inductor induces a net flux in the RF SQUID of 0.5 $\Phi_0$ allowing maximum coupling between the first device and the second device.

8. The system of claim 7, wherein the first device is a qubit.

9. The system of claim 8, wherein the second device is a qubit.

10. The system of claim 1, further comprising a controller configured to control the inductance of the variable inductance coupling element between a low inductance state to provide strong coupling between a first device coupled to the first port and a second device coupled to the second port, and a high inductance state to provide isolation between the first device and the second device.

11. A superconducting system comprising:
    a coplanar circuit comprising:
       a first ground plane region;
       a second ground plane region electrically isolated from the first ground plane region by portions of the superconducting circuit: and
       a tunable coupler having a first port and a second port, the tunable coupler comprising:
          a Josephson junction;
          a first termination inductor having a first end coupled between a first end of the Josephson junction and the first port and a second end coupled to the first ground plane region;
          a second termination inductor having a first end coupled between a second end of the Josephson junction and the second port and a second end coupled to the second ground plane region;
          a third termination inductor having a first end coupled between the first end of the Josephson junction and the first port and a second end coupled to the second ground plane region; and
          a fourth termination inductor having a first end coupled between the second end of the Josephson junction and the second port and a second end coupled to the first ground plane region, wherein the equivalent inductance of the first and third termination inductors, the Josephson junction and the equivalent inductance of the second and fourth termination inductors combine to form an RF SQUID; and
    a controller configured to control the inductance of the Josephson junction between a low inductance state to provide strong coupling between a first device coupled to the first port and a second device coupled to the second port, and a high inductance state to provide isolation between the first device and the second device.

12. The system of claim 11, further comprising a bias inductor inductively coupled to the RF SQUID, wherein an amount of current through the bias inductor controls the coupling strength between the first and the second devices.

13. The system of claim 12, wherein one of a zero current through the bias inductor induces no net flux in the RF SQUID allowing for coupling between the first and second devices, a first current through the bias inductor induces a net flux in the RF SQUID of about 0.4 $\Phi_0$, where $\Phi_0$ is equal to a flux quantum allowing maximum isolation between the first and second devices, and a second current through the bias inductor induces a net flux in the RF SQUID of 0.5 $\Phi_0$ allowing maximum coupling between the first and second devices.

14. The system of claim 11, wherein the first device is a qubit.

15. The system of claim 14, wherein the second device is a qubit.

16. The system of claim 11, further comprising a fifth inductor having a first end coupled to the Josephson junction, and a second end coupled between the first and third termination inductors, wherein the equivalent inductance of the first and third termination inductors, the Josephson junction and the equivalent inductance of the second and fourth termination inductors and fifth inductor combine to form the RF SQUID.

17. A superconducting coplanar circuit comprising:
a first ground plane region;
a second ground plane region electrically isolated from the first ground plane region by portions of the superconducting coplanar circuit: and
a tunable coupler having a first port and a second port, the tunable coupler comprising:
  a variable inductance coupling element;
  a first termination inductor having a first end coupled between a first end of the variable inductance element and the first port and a second end coupled to the first ground plane region;
  a second termination inductor having a first end coupled between a second end of the variable inductance element and the second port and a second end coupled to the second ground plane region;
  a third termination inductor having a first end coupled between the first end of the Josephson junction and the first port and a second end coupled to the second ground plane region;
  a fourth termination inductor having a first end coupled between the second end of the Josephson junction and the second port and a second end coupled to the first ground plane region; and
  a fifth inductor having a first end coupled to the Josephson junction, and a second end coupled between the first and third termination inductors, wherein the equivalent inductance of the first and third termination inductors, the Josephson junction and the equivalent inductance of the second and fourth termination inductors and fifth inductor combine to form an RF SQUID;
a qubit coupled to the first port; and
a bias inductor inductively coupled to the RF SQUID, wherein an amount of current through the bias inductor controls the coupling strength between the qubit and a second device coupled to the second port.

18. The circuit of claim 17, wherein the second device is a qubit.

19. The circuit of claim 17, further comprising a controller configured to control an amount of current through the bias inductor to set the Josephson junction between a low inductance state to provide strong coupling between the qubit and the second device, and a high inductance state to provide isolation between the qubit and the second device.

20. The circuit of claim 19, wherein one of a zero current through the bias inductor induces no net flux in the RF SQUID allowing for coupling between the qubit and the second device, a first current through the bias inductor induces a net flux in the RF SQUID of about 0.4 $\Phi_0$, where $\Phi_0$ is equal to a flux quantum allowing maximum isolation between the qubit and the second device, and a second current through the bias inductor induces a net flux in the RF SQUID of 0.5 $\Phi_0$ allowing maximum coupling between the qubit and the second device.

* * * * *